US006943662B2

(12) United States Patent
Tanimura

(10) Patent No.: US 6,943,662 B2
(45) Date of Patent: Sep. 13, 2005

(54) CHIP RESISTOR

(75) Inventor: Masanori Tanimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/306,715

(22) Filed: Nov. 29, 2002

(65) Prior Publication Data

US 2003/0127706 A1 Jul. 10, 2003

(30) Foreign Application Priority Data

Nov. 30, 2001 (JP) ....................................... 2001-366791

(51) Int. Cl.[7] .......................... H01C 1/012; H01L 29/00
(52) U.S. Cl. ....................................... 338/309; 257/537
(58) Field of Search ................................ 257/536, 537; 338/308, 309

(56) References Cited

U.S. PATENT DOCUMENTS 6,356,184 B1 * 3/2002 Doi et al. ................... 338/309
6,492,896 B2 * 12/2002 Yoneda ...................... 338/309

* cited by examiner

*Primary Examiner*—Gene M. Munson
(74) *Attorney, Agent, or Firm*—Sughrue Mion, PLLC

(57) ABSTRACT

Resistance or side electrodes of a chip resistor is prevented from being lost due to chemical reaction with NaCl contained in human sweat and so on when human sweat, seawater, etc. are adhered thereto. The chip resistor comprises an insulating substrate, thick-film upper surface electrodes formed at opposite ends of the top surface of the insulating substrate, a thin-film resistance made of a constituent material not reacting with NaCl, and formed so as to be extended over the upper surface of the insulating substrate and respective portions of the upper surface of the thick-film upper surface electrodes, thick-film back surface electrodes formed at spots on the back surface of the insulating substrate, corresponding to the thick-film upper surface electrodes, respectively, and thick-film side surface electrodes connecting the thick-film back surface electrodes with respective portions of the thick-film upper surface electrodes, exposed out of the thin-film resistance, respectively.

2 Claims, 9 Drawing Sheets

CHIP RESISTOR

BACKGROUND OF THE INVENTION

1. Field of the Invention

The invention relates to a chip resistor comprising a chip type insulating substrate with a thin-film resistance provided thereon. More specifically, the invention is intended to provide a chip resistor provided with a resistance or electrodes that will not be lost upon coming in contact with human sweat or seawater.

2. Description of the Related Art

Conventional chip resistors include a thick-film resistor provided with electrodes and a resistance, formed by printing and firing constituent materials thereof, and a thin-film resistor provided with electrodes and a resistance, formed by sputtering constituent materials thereof. Both are substantially same in construction although they differ from each other in that one is formed of a thick-film while the other is formed of a thin-film, and in respect of vertical relationship between the resistance and upper electrodes. That is, as shown in FIG. 9, at opposite ends of an insulating substrate 1 made of alumina, and so forth, there are provided a pair of electrodes 2, 3, formed of upper surface electrodes 21, 31, back surface electrodes 22, 32, and side surface electrodes 23, 33, respectively, the side surface electrodes 23, 33 connecting the upper surface electrodes with the back surface electrodes, respectively, and a resistance 4 is formed on top of the insulating substrate 1 in such a way as to be connected to both the electrodes 2, 3. A protection film 5 in one to three layers is formed on the top surface side of the resistance 4.

The thick-film resistor is obtained by forming respective layers by applying a constituent material, reduced to a paste form with the use of glass or resin, to a substrate by printing and so forth, and subsequently, by firing the constituent material (in the case of glass) at a temperature in the range of 600 to 900° C. or curing the constituent material (in the case of resin) at a temperature in the range of 200 to 240° C. For the constituent material of electrodes, use is made of an Ag based metal paste with Pd added to Ag or an Au based metal paste with Au as the primary constituent thereof, and for the constituent material of a resistance, use is made of ruthenium oxide ($RuO_2$) with Ag, and so forth, mixed therewith, for obtaining a necessary resistance value, and reduced to a paste form with the use of glass or resin. The thin-film resistor is obtained by forming films by means of, for example, sputtering metallic materials, and patterning the films, and for the constituent material of electrodes, use is made of Al, Ni, Cr, Cu, and so forth while for the constituent material of a resistance, use is made of Ni—Cr alloy, and so firth, Herein, the thick-film refers to a film formed by applying the constituent material of electrodes or a resistance, reduced to a paste form, to a substrate, and subsequently, by firing or curing the same while the thin-film refers to a film formed by directly forming a metal film, and so forth, by the sputtering method and so forth.

Now, in order to obtain a high-precision chip resistor, a resistance needs to be formed of a thin film, and chip resistors (thin-film chip resistors), using thin films made of Ni—Cr for a resistance and side electrodes, have been extensively fabricated. Such thin-film resistors, however, have a problem in that if, for example, human sweat, seawater, etc. are adhered thereto, there occurs chemical reaction between NaCl contained in human sweat, seawater, etc. and Ni—Cr due to presence of moisture, thereby causing the thin films made of Ni—Cr to be lost.

In such a case, as for the resistance, a constituent material other than Ni—Cr, not reacting with NaCl etc., can be selected, however, for the side electrodes, use of Ni—Cr or Ni—Ti is unavoidable in view of such problems as resistivity and oxidation, so that it has been impossible to resolve the problem described above.

The invention has been developed to resolve the problem described above, and it is an object of the invention to provide a chip resistor of a construction capable of maintaining accuracy of a resistance value, and protecting side electrodes from being lost due to reaction of the side electrodes with moisture as well as NaCl etc., contained in human sweat, and so on, and a method of fabricating the same. Further, the invention is intended to provide a chip resistor capable of coping with deterioration in tackiness, occurring when a thick-film is formed on top of a thin-film.

SUMMARY OF THE INVENTION

The chip resistor of the first aspect of the invention comprises an insulating substrate, thick-film upper surface electrodes formed at opposite ends of the top surface of the insulating substrate, a thin-film resistance made of a constituent material not reacting with NaCl, and formed so as to be extended over the upper surface of the insulating substrate and respective portions of the upper surface of the thick-film upper surface electrodes, thick-film back surface electrodes formed at spots on the back surface of the insulating substrate, corresponding to the thick-film upper surface electrodes, respectively, and thick-film side surface electrodes connecting the thick-film back surface electrodes with respective portions of the thick-film upper surface electrodes, exposed out of the thin-film resistance, respectively.

The chip resistor of the second aspect of the invention is characterized in that the thin-film resistance as in the first aspect of the invention is formed by stacking thin films, and at least the outermost layer thereof is made of a constituent material not reacting with NaCl.

The chip resistor of the third aspect of the invention is characterized in that the thick-film upper surface electrodes as in the first and second aspect of the invention comprise first thick-film upper surface electrodes and second thick-film upper surface electrodes, electrically conductive with the first thick-film upper surface electrodes, and opposite ends of the thin-film resistance are sandwiched between the first thick-film upper surface electrodes and the second thick-film upper surface electrodes, respectively.

DESCRIPTION OF THE PREFERRED EMBODIMENTS

Embodiments of a chip resistor according to the invention are described hereinafter with reference to the accompanying drawings.

First Embodiment

Figure 1:
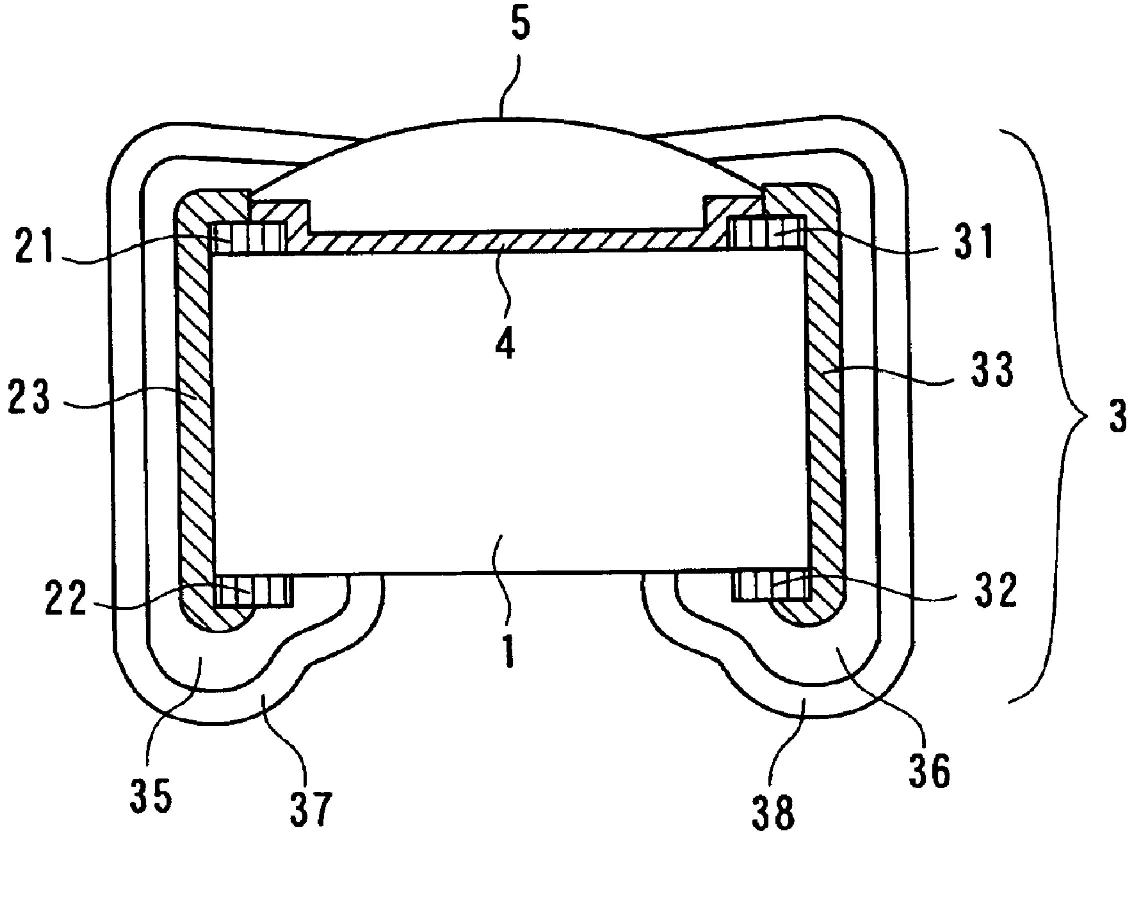
FIG. 1 is a sectional view showing a first embodiment of a chip resistor according to the invention.

As schematically shown in FIG. 1, with a chip resistor according to a first embodiment, there are provided upper surface electrodes 21, 31, formed of a thick-film, and back surface electrodes 22, 32, formed of a thick-film, at opposite ends of the top surface and back surface of an insulating substrate 1 made of, for example, alumina, and rectangular in plan view, respectively, and further, the upper surface electrodes and the back surface and electrodes are electrically bonded with each other through the intermediary of thick-film electrodes such as side surface electrodes 23, 33, respectively. Further, a thin-film resistance 4 is formed on an exposed part between the opposite ends of the top surface of the insulating substrate 1, and on respective portions of the upper surface electrodes, and in addition, a protection film 5 is provided on the top surface of the resistance 4.

In the figure, for the substrate 1, use is made of, for example, alumina, sapphire, or Si wafer, and so forth. For the constituent material of the thick-film electrodes, use is generally made of metal powders mixed with glass or resin, reduced to a paste form, and depending on the kind of metal powders to be mixed, any of an Ag based material, Ag—Pd based material, Au based material, and so forth is in use. Herein, by "based" is meant that other elements can be added to a constituent material containing Ag, Au, etc. as its primary constituent. In this connection, glass paste is hardened at a temperature in the range of about 600 to 900° C. while resin paste is cured at a temperature in the range of about 200 to 240° C.

The chip resistor has a construction enabling soldering to a mounting board such as a printed board by surface mounting from the back surface of the substrate 1, making use of the thick-film side surface electrodes. More specifically, the upper surface electrodes of the thick film, 21, 31 and the back surface electrodes of the thick film, 22, 32 are formed at the opposite ends of the top and bottom surfaces of the insulating substrate 1, respectively, so as to face each other, by printing Ag-Pd or Au and a binder constituent, reduced to a paste form by use of an organic solvent, (namely, an Ag based or Au based paste), and by firing the Ag based or Au based paste. Then, after adjustment of a resistance value of the resistance 4 made of a constituent material not reacting with NaCl, such as, for example, Ta—N, Ta—Cr, etc., the constituent material of electrodes, made of a resin-Ag based paste, is printed on the side surfaces of the substrate 1 so as to overlap the upper surface electrodes, 21, 31 and the back surface electrodes 22, 32, respectively, and is cured, thereby forming the side surface electrodes 23, 33 of the thick film, respectively. Further, first plating layers 35, 36, made of Ni, and second plating layers 37, 38, made of Pb/Sn, Sn, etc., are provided on respective exposed surfaces of the side surface electrodes 23, 33.

With the chip resistor according to the present embodiment, only the resistance 4 that has significant effects on accuracy of its resistance value and properties resistant to noise and so forth is formed of the thin film made by the sputtering method and so forth, while others such as the upper surface electrodes, 21, 31, the back surface electrodes 22, 32, the side surface electrodes 23, 33, and so forth are formed of the thick film, respectively.

The resistance 4 is formed of the thin film obtained by selecting a metal other than Ni—Cr alloy, such as, for example, a Ta—N based metal, Ta—Cr based metal, etc., depending on a desired resistance value, forming a film of the metal by sputtering and so forth, and patterning the film into a desired shape by use of the photolithographic technique.

In this case, by "based" is meant that a resistance value can be adjusted by addition of Al, Cr, O, and so forth.

With the embodiment shown in FIG. 1, the protection film 5 is formed in one layer, however, the protection film 5 need not necessarily be formed of one layer, but may be formed in two or three layers.

Figure 2:
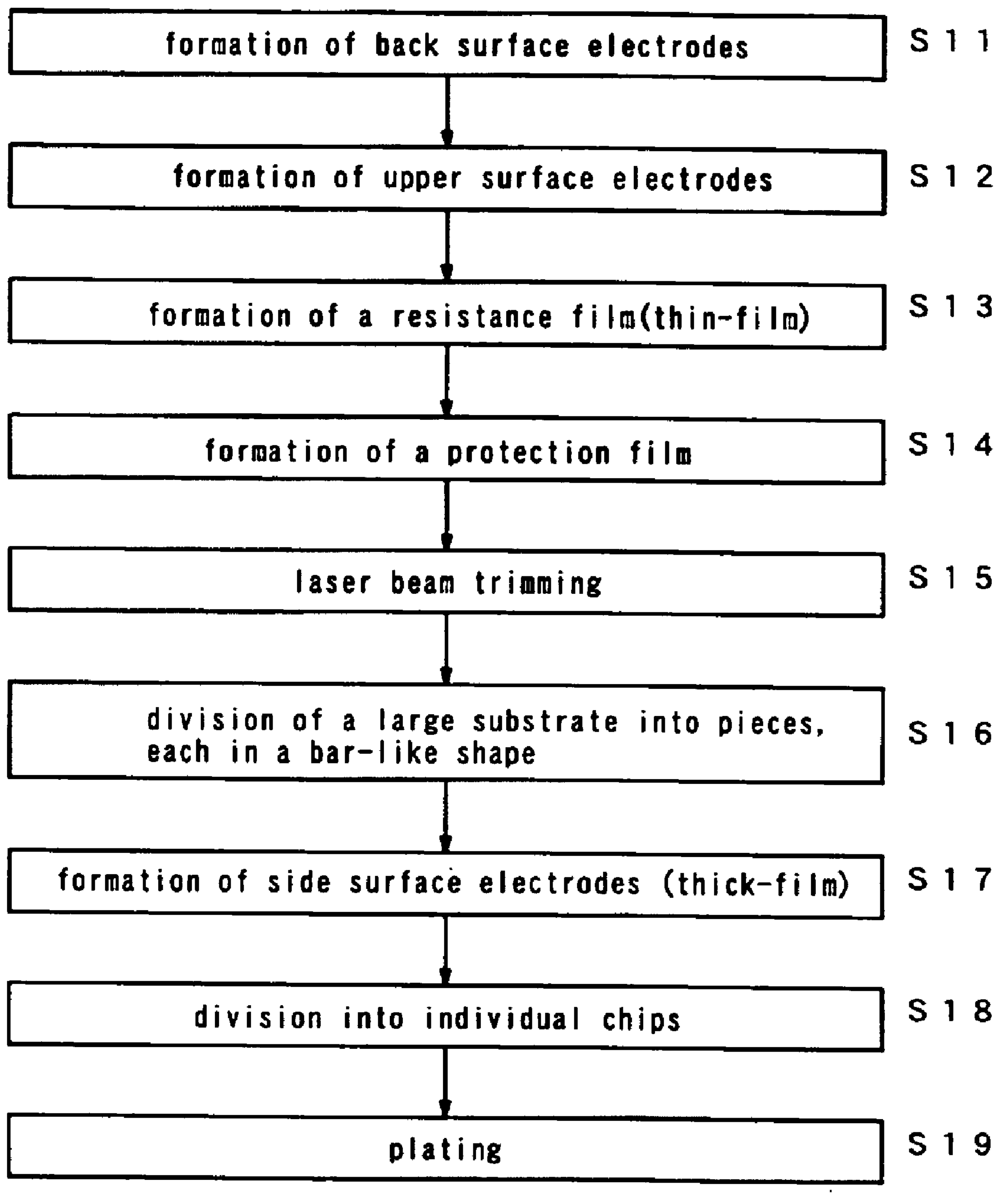
FIG. 2 is a flow chart showing the steps of fabricating principal parts of the chip resistor according to the first embodiment.

Next, a method of fabricating the chip resistor is described hereinafter with reference to a flow chart shown in FIG. 2. In FIG. 2, a flow chart for fabricating one unit of the chip resistor is shown, however, in the case of actual fabrication, electrodes and resistances, corresponding to about 100 to 10,000 units thereof, respectively, are simultaneously formed on a large substrate about 5 to 10 cm in width ×5 to 10 cm in length, and by cutting or dividing the large substrate into pieces, each in a bar-like shape, the side surface electrodes are formed on respective exposed side surfaces of the pieces, and subsequently, chip resistors linked together, each in a bar-like shape, are cut or divided into individual chips to be thereby separated, thus fabricating a multitude of completed chip resistors.

First, paste of the constituent material of the electrodes (a binder constituent and Ag—Pd or Au, reduced to a paste form by use of an organic solvent) is printed to predetermined spots on the back surface of the substrate 1 and by firing the paste at a temperature in the range of about 600 to 900° C., the back surface electrodes 22, 32 (refer to FIG. 1) are formed (S11). Subsequently, by applying paste of the constituent material of the electrodes to predetermined spots (parts of the top surface, corresponding to the back surface electrodes 22, 32, respectively) on the top surface of the substrate 1, by means of printing, and by firing the paste, the upper surface electrodes 21, 31, formed of the thick film, are formed (S12). Thereafter, a thin-film resistance film is formed on the top surface of the substrate 1, and on the respective portions of the upper surface electrodes with a sputtering system, and is subsequently patterned into a desired shape, thereby forming the thin-film resistance 4 made of Ta—N, Ta—Cr, and so forth (S13).

Then, the protection film 5 is formed (S14), laser beam trimming is applied to the resistance 4 (S15), and further, the large substrate 1 is cut or divided into pieces, each in a bar-like shape, such that respective pieces are aligned in a row in the direction orthogonal to a direction along which the pair of the electrodes 21, 31 are lined up (S16). Subsequently, the constituent material of the electrodes of an Ag-based resin paste is applied on respective side surfaces of the substrate 1, between the upper surface electrodes 21, 31 and the back surface electrodes 22, 32, respectively, so as to overlap the upper surface electrodes and the back surface electrodes, respectively, and is cured, thereby forming the side surface electrodes 23, 33 (S17). Thereafter, by dividing chip resistors linked together, each in a bar-like shape, into individual chips (S18), and by applying Ni plating and plating with solder made of Pb/Sn etc. to respective exposed surfaces of the electrodes (S19), the chip resistor shown in FIG. 1 is obtained.

Second Embodiment

Figure 3:
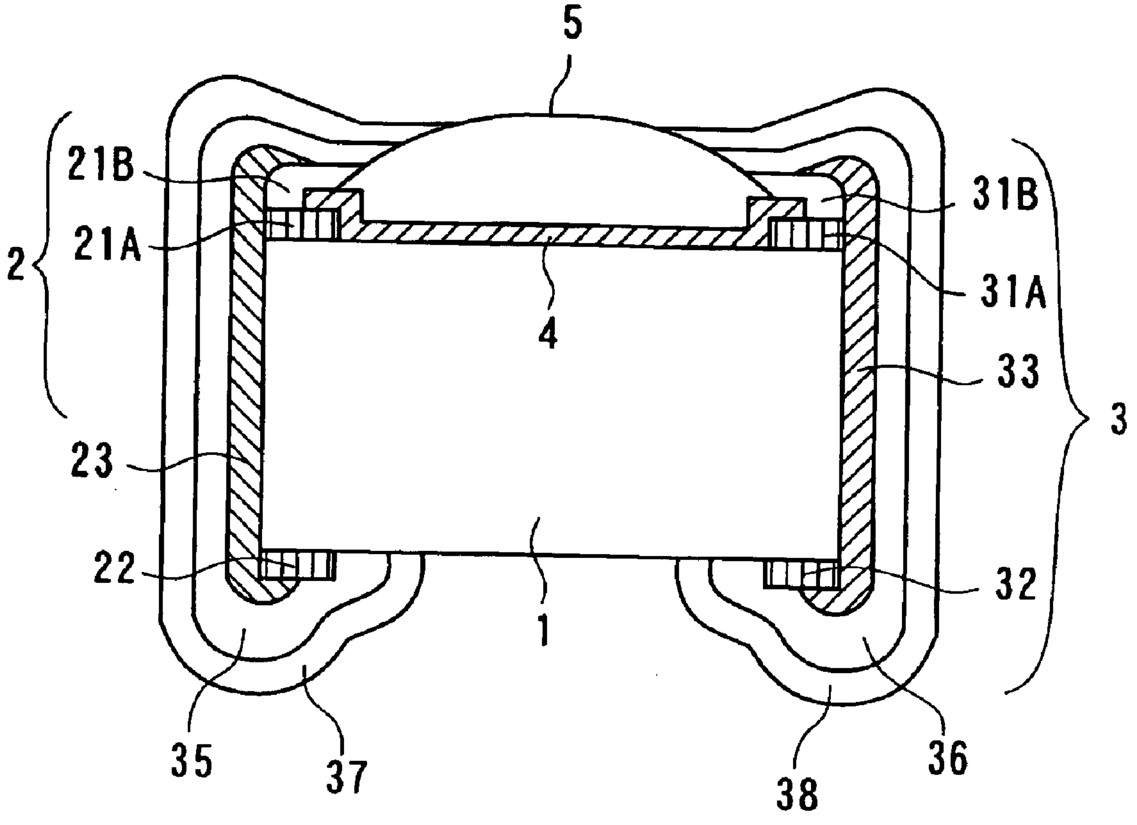
FIG. 3 is a sectional view showing a second embodiment of a chip resistor according to the invention.

FIG. 3 shows a second embodiment of a chip resistor according to the invention.

The second embodiment shown in FIG. 3 is the same as the first embodiment except that thick-film upper surface electrodes 21, 31 are divided into first upper surface electrodes 21A, 31A and thick-film auxiliary electrodes 21B, 31B as second upper surface electrodes, and a resistance 4 formed of a thin film is sandwiched between the first upper surface electrodes 21A, 31A, formed of the thick film, and the second upper surface electrodes 21B, 31B, formed of the thick film, thereby making up a sandwich structure.

Further, a method of fabricating the chip resistor according to the second embodiment is the same as the method of fabricating the chip resistor according to the first embodiment except that after the thin-film resistance 4 made of Ta—N, Ta—Cr, etc. are formed as in the method of fabricating the chip resistor according to the first embodiment, the thick-film auxiliary electrodes 21B, 31B are formed by applying the constituent material of electrodes, in paste form, made of, for example, Ag etc. mixed with resin (Ag based resin paste), to the first upper surface electrodes 21A, 31A, and respective portions of the thin-film resistance 4, on top thereof, and by curing the constituent material of the electrodes at a temperature around 200° C.

Incidentally, in the case where a chip resistor is fabricated of a composite body made up of a thin-film and a thick-film, and in particular, in the case of the thick film being formed on top of the thin-film, this will present a problem such that tackiness therebetween deteriorates and contact resistance increases, causing the films to become prone to exfoliation from each other in the extreme case.

Third Embodiment

Figure 4:
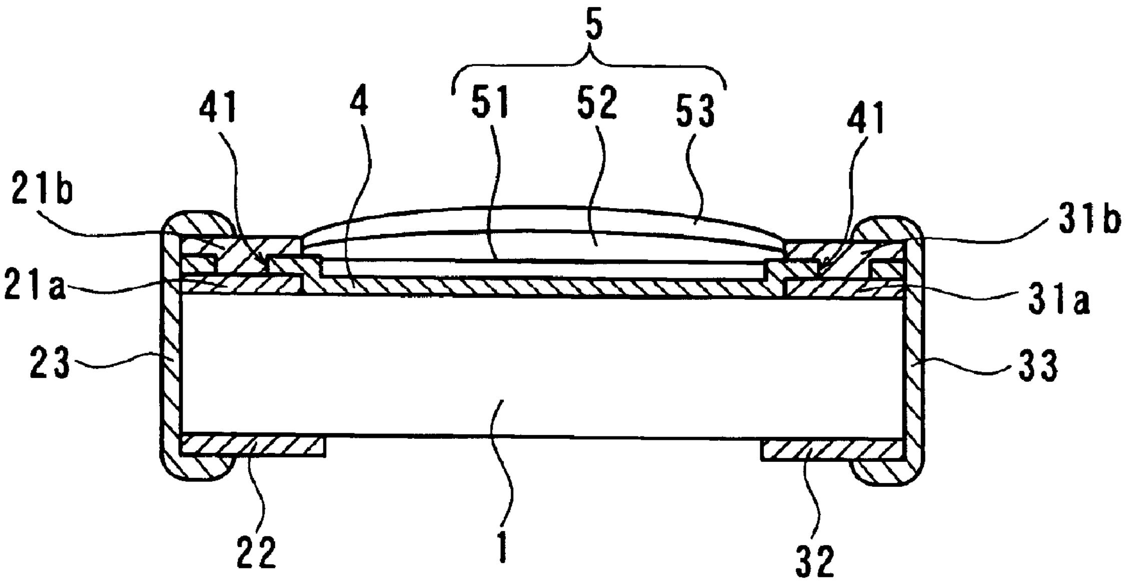
FIG. 4 is a sectional view showing a third embodiment of a chip resistor according to the invention.

FIG. 4 shows a third embodiment of a chip resistor according to the invention, wherein in the case of adopting a composite body made up of a thin-film and a thick-film, and in particular, in the case of adopting a construction in which a thick-film is formed on top of a thin-film, means for enhancing tackiness between the thin-film and the thick-film formed thereon are provided.

That is, with the third embodiment shown in FIG. 4, upper surface electrodes 21, 31 are divided into first upper surface electrodes 21*a*, 31*a* and second upper surface electrodes 21*b*, 31*b* and a resistance 4 formed of the thin-film is sandwiched between the first upper surface electrodes 21*a*, 31*a*, formed of the thick film, and the second upper surface electrodes 21*b*, 31*b*, formed of the thick film as with the second embodiment, however, in this case, a through-hole 41 is provided in part of the resistance 4, on top of respective portions of the first upper surface electrodes 21*a*, 31*a*, thereby keeping the first upper surface electrodes 21*a*, 31*b* in intimate contact with the second upper surface electrodes 21*b*, 31*b*, respectively.

Constituent materials of a substrate 1, the thick-film electrodes, and so forth are the same as those for the first embodiment.

More specifically, by applying Au and a binder constituent, reduced into a paste form by use of an organic solvent, (an Au based paste) to the back and top surfaces of the substrate 1, respectively, and by firing the Au based paste, back surface electrodes 22, 32 of the thick-film, and the first upper surface electrodes 21*a*, 31*b* of the thick-film, are formed. Subsequently, after adjustment of a resistance value of the resistance 4, the second upper surface electrodes 21*b*, 31*b* are formed of an Ag based resin paste, and thereafter, by printing the constituent material of electrodes, made of a resin paste, on respective side surfaces of the substrate 1 so as to overlap the upper surface electrodes 21, 31 and the back surface electrodes 22, 32, respectively, and by curing the constituent material of the electrodes, side surface electrodes 23, 33, of the thick-film are formed. Further, Ni plating and plating with solder made of Pb/Sn, although not shown in the figure, are applied to respective exposed surfaces of the electrodes described above.

As with the first embodiment, the resistance 4 is formed of a thin-film obtained by sputtering and so forth, and by pattering the thin film in a desired shape by use of the photolithographic technique. At the time of the patterning, the part of the resistance 4, on top of the respective portions of the first upper surface electrodes 21*a*, 31*a*, is also etched, and the through-hole 41 is thereby formed such that respective parts of the first upper surface electrodes 21, 31*a* are exposed. In the respective portions of the first upper surface electrodes 21, 31*a*, plural units of the through-holes 41 instead of a single unit thereof may be formed, and the through-holes 41 may be in any suitable shape such as a slit-like shape, and so forth. When the second upper surface electrodes 21*b*, 31*b* are formed on top of the through-holes 41, the through-holes 41 are filled up with the constituent material of the second upper surface electrodes 21*b*, 31*b*, respectively, so that the second upper surface electrodes 21*b*, 31*b* come into intimate contact with the first upper surface electrodes 21*a*, 31*a* to be bonded therewith.

Thus, with the embodiment shown in FIG. 4, the resistance 4 is sandwiched between the first upper surface electrodes 21*a*, 31*a* and the second upper surface electrodes 21*b*, 31*b* that are kept in intimate contact with the first upper surface electrodes 21*a*, 31*a*, respectively, thereby providing means for enhancing tackiness between the resistance 4 and the second upper surface electrodes 21*b*, 31*b*, formed thereon.

Further, with the embodiment shown in FIG. 4, a protection film 5 is formed in three layers, however, since three layers are not necessarily required, one layer or two layers may suffice. A first protection film 51 is formed by forming a film from, for example, an insulating material by the thin-film forming method. Because there is provided the step of cutting way portions of the resistance 4 by laser beam trimming after the formation of the resistance 4 while measuring a resistance value thereof for adjustment of the resistance value, the first protection film 51 is provided for the purpose of preventing change in performance of the resistance 4 due to portions of the constituent material thereof, cut away during the step, flying off, and adhering again onto the resistance 4. However, in case there is no cause for such worry, there is no particular need for providing the first protection film 51.

A second protection film 52, and a third protection film 53 are applied onto the first protection film 51 with pits and projections formed thereon, as a result of laser beam trimming applied thereto, in order to protect the entire top surface of the chip resistor as well as exposed portions of the top surface of the resistance 4. Since with the second protection film 52 alone, grooves formed by laser beam trimming cannot be fully filled up for planarization, the third protection film 53 is further provided, thereby fully covering and planarizing the top surface. Since there is a possibility of the second and third protection films 52, 53 causing a change of the resistance value of the resistance 4 if fired at a high temperature, these are preferably formed by applying a paste made of resin such as an epoxy resin, and so forth, and by curing the same at a temperature in the range of about 200 to 240° C. However, these may be formed by printing a glass based paste, made of lead borosilicate glass, and so forth, and by sintering the same at a temperature in the range of about 600 to 700° C.

Figure 5A:
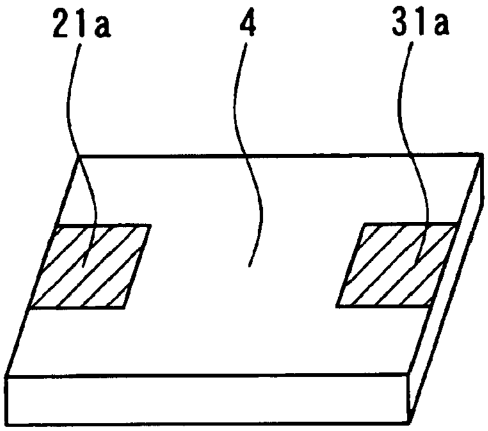
FIG. 5 is a schematic illustration showing the steps of fabricating the principal parts of the chip resistor in FIG. 4.
Figure 5B:
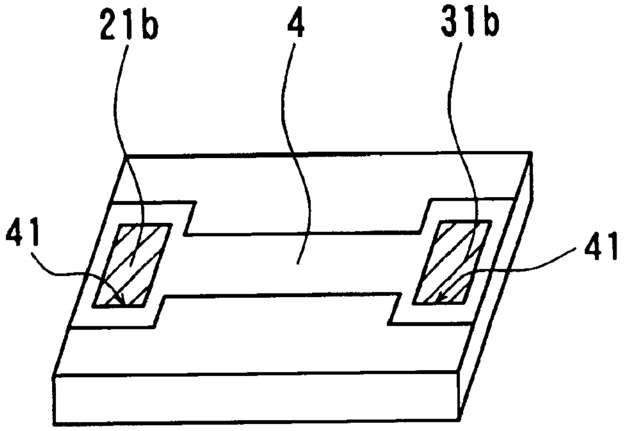
Figure 5C:
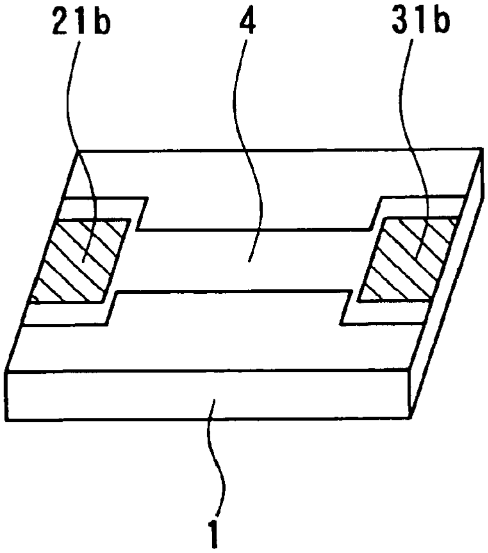

Now, a process of fabricating the chip resistor shown in FIG. 4 is described hereinafter with reference to a schematic illustration of the steps of fabricating the principal parts thereof, shown in FIG. 5, and a flow chart shown in FIG. 6.

Figure 6:
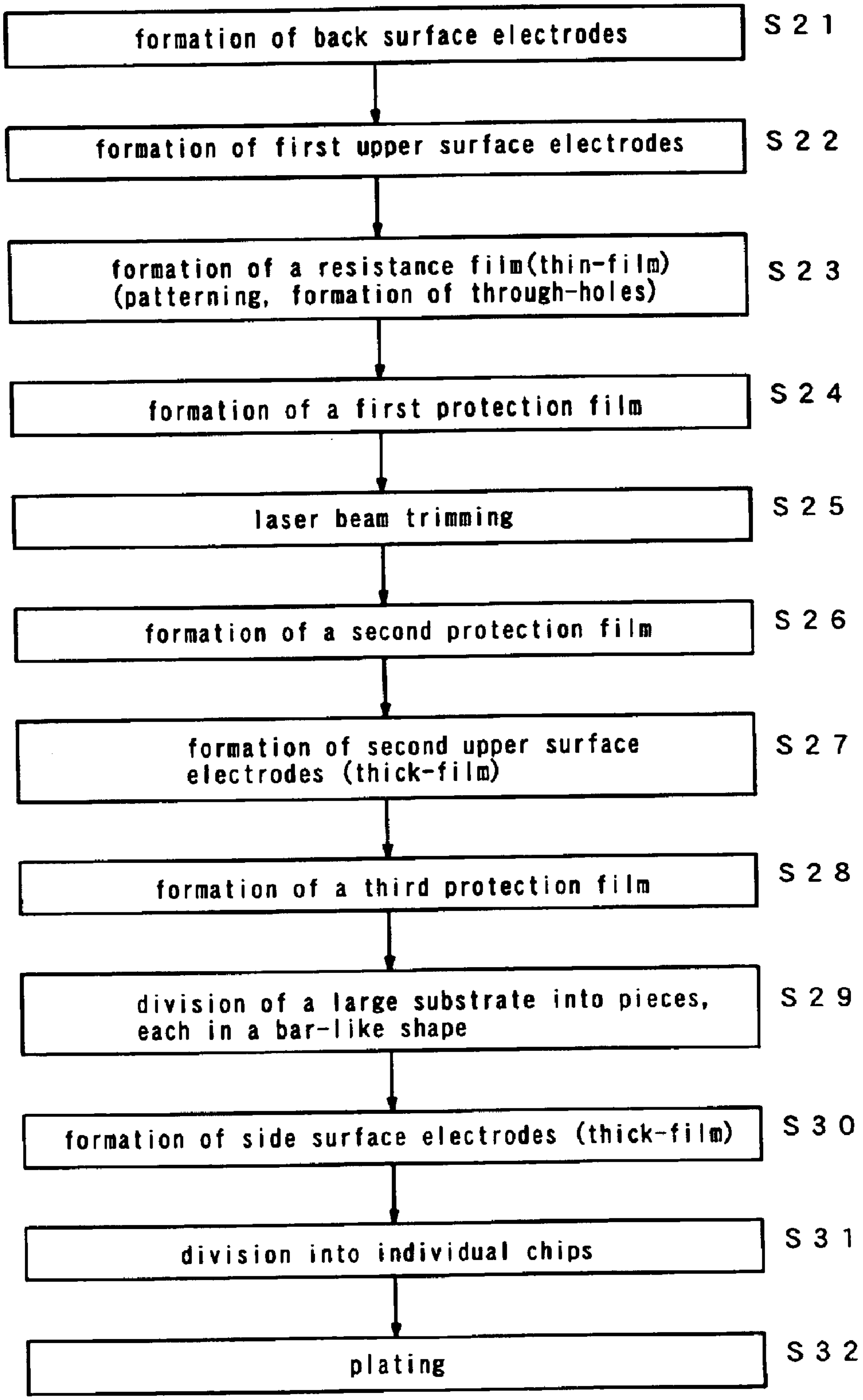
FIG. 6 is an example of a flow chart showing the steps of fabricating the chip resistor in FIG. 4.

In a step (S21) shown in FIG. 6, paste of the constituent material of the electrodes is applied to predetermined spots on the back surface of the substrate 1, and by firing the paste at a temperature in the range of about 600 to 900° C., the back surface electrodes 22, 32 (refer to FIG. 4) are formed. Subsequently, by applying the constituent material of the electrodes to predetermined spots (parts of the top surface, corresponding to the back surface electrodes 22, 32, respectively) on the top surface of the substrate 1, by means of printing, and by firing the same, the first upper surface electrodes 21*a*, 31*a* are formed (S22, refer to FIG. 5A). Thereafter, a thin-film resistance film is formed on the entire top surface of the substrate 1 with a sputtering system, and by patterning the thin-film resistance film in a desired shape, the resistance 4 is formed. At the time of the patterning, by etching a part of the resistance film, on top of respective portions of the first upper surface electrodes 21*a*, 31*a* in such way as to expose respective parts of the first upper surface electrodes 21*a*, 31*a*, the through-holes 41 are formed (S23, refer to FIG. 5B).

Thereafter, by forming a thin-film made of $Al_2O_3$, $SiO_2$, SiN, and so forth, on the top surface of the resistance 4, or by applying a glass paste containing Pb glass, and so forth, to the top surface of the resistance 4 by means of printing and by firing the same, the first protection film 51 is formed (S24). Then, while measuring a resistance value of the resistance 4 by bringing a probe electrode into contact with a pair of the first upper surface electrodes 21*a*, 31*a*, respectively, laser beam trimming of the resistance 4 is executed to adjust the resistance value (S25). Further, by applying a resin paste to the top surface of the first protection film 51 and curing the resin paste, the second protection film 52 is formed (S26). Subsequently, by applying the constituent material of electrodes, in paste form, made of, for example, Ag etc. mixed with resin (an Ag based resin paste), to the first upper surface electrodes 21*a*, 31*a*, and respective portions of the thin film resistance 4, formed thereon, and by curing the constituent material of the electrodes at a temperature around 200° C., the second upper surface electrodes of the thick-film (thick-film auxiliary electrodes) 21*b*, 31*b* are formed (S27, refer to FIG. 5C).

Thereafter, by applying the same constituent material as that for the second protection film 52, and curing the same, the third protection film 53 is formed over the resistance 4 between the second upper surface electrodes 21*b*, and 31*b* (S28).

Subsequently, a large substrate 1 is cut or divided into pieces, each in a bar-like shape, such that respective pieces are aligned in a row in the direction orthogonal to a direction along which the pair of the electrodes 21, 31 are lined up (S29). Then, by applying the constituent material of electrodes, made of an Ag-based resin paste, is applied on respective side surfaces of the substrate 1, between the second upper surface electrodes 21*b*, 31*b* and the back surface electrodes 22, 32, respectively, so as to overlap the first and second upper surface electrodes 21*a*, 31*a,* and 21*b*, 31*b* as well as the back surface electrodes 22, 32, respectively, and by curing the same, the side surface electrodes 23, 33 are formed (S30). Thereafter, by dividing chip resistors linked together, each in a bar-like shape, into individual chips (S31), and by applying Ni plating and plating with solder made of Pb/Sn etc. to respective exposed surfaces of the electrodes (S32), the chip resistor as shown in FIG. 4 is obtained.

In the case where the thick-film electrodes, such as, for example, the side electrodes, are formed over the thin-film resistance, complete adhesion therebetween cannot generally be obtained, so that contact resistance tends to occur. With the second and third embodiments, however, the upper surface electrodes are divided into the first upper surface electrodes and the second upper surface electrodes, both of which are partially connected with each other, and the first upper surface electrodes are formed underneath portions of the thin-film resistance while forming the second upper surface electrodes on top of portions of the thin-film resistance, respectively. In particular, with the third embodiment, the through-hole is provided in at least part of the resistance on top of the respective portions of the first upper surface electrodes, thereby keeping the first upper surface electrodes in direct contact with the second upper surface electrodes, respectively.

Thus, with the second and third embodiments, since both the first upper surface electrodes and the second upper surface electrodes are formed of the thick-film, respectively, adhesion between these thick-films is excellent, and adhesion between the first upper surface electrodes and the thin-film resistance is also excellent since this is a case of a thin-film provided on top of a thick film. Further, with any of the first to third embodiments described, the side electrodes of the thick-film are formed so as to be in contact with the top surface of the upper surface electrodes of the thick-film, respectively, so that the side electrodes, the upper surface electrodes, and the back surface electrodes are in contact with each other, respectively, with a very low resistance and excellent tackiness since this is a case of contact among thick-films themselves, causing no deterioration in resistance characteristics.

Now, with those embodiments described hereinbefore, the means for enhancing tackiness between the thin-film resistance and the thick-film electrodes (the upper surface electrodes 21, 31) provided thereon are to adopt the sandwich structure in which the upper surface electrodes are formed in two layers, and the thin-film resistance is sandwiched between the two layers.

Figure 7:
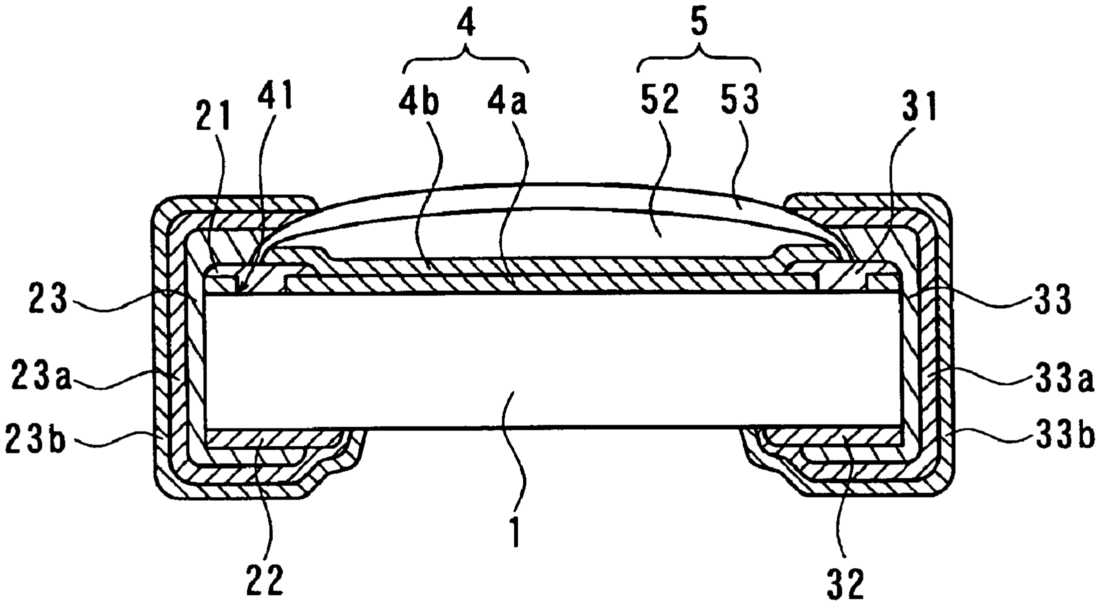
FIG. 7 is a sectional view showing another embodiment of a chip resistor according to the invention.

With a chip resistor according to another embodiment, shown in FIG. 7, however, a construction is adopted such that a resistance 4 is formed in two layers, thick-film electrodes (upper surface electrodes) are sandwiched between the two layers, thereby attempting to enhance tackiness, and by exposing portions of the upper surface electrodes formed of the thick film, the upper surface electrodes are in contact with side electrodes, respectively.

More specifically, in FIG. 7, on top of an insulating substrate 1, there are provided a first layer 4*a* formed of a thin-film made of, for example, a Ni—Cr resistance, and a second layer 4*b* formed of a thin-film made of, for example, a Ta—N resistance, and so forth, both the thin-films being formed by means of sputtering and so forth. The upper surface electrodes 21, 31, formed of the thick film, are sandwiched between the first layer 4*a* and the second layer 4*b*, at opposite ends thereof, respectively. Further, the upper surface electrodes 21, 31 are directly bonded with the insulating substrate 1 via through-holes 41 formed in the first layer 4*a*, and the resistance 4 and the upper surface electrodes 21, 31 are formed such that respective portions of the upper surface of the upper surface electrodes 21, 31 are exposed out of the second layer 4*b* so as to enable, for example, the side electrodes to be connected with the upper surface electrodes. This embodiment is the same in other respects as the previously described embodiment shown in FIG. 4, and parts corresponding to those in FIG. 4 are denoted by the same reference numerals, omitting description thereof.

In FIG. 7, a protection film 5 of a dual-layer structure is shown, and the side electrodes 23, 33 are shown to be covered with Ni plating layers 23*a*, 33*a*, and Pb/Sn plating layers 23*b*, 33*b*, respectively. Otherwise, the constituent materials of the insulating substrate 1, the resistance 4, and so forth are the same as those for the previously described embodiments, description thereof therefore being omitted.

Figure 8A:
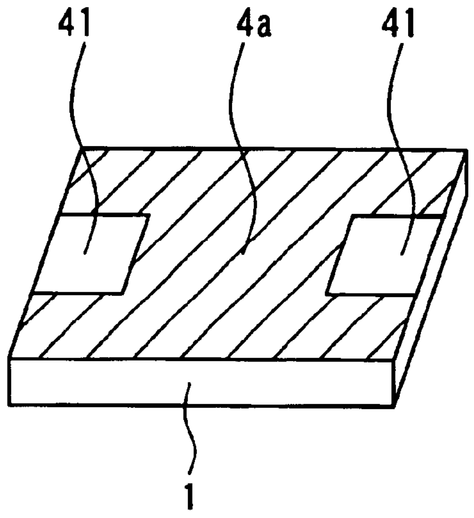
FIG. 8 is a schematic illustration showing the steps of fabricating the principal parts of the chip resistor in FIG. 7.

In fabricating the chip resistor according to the present embodiment, back surface electrodes are first formed of a thick-film on the back surface of the insulating substrate 1, and subsequently, as shown in FIG. 8A, the first layer 4*a* is formed of the thin-film, made of, for example, Ni—Cr, provided on the entire top surface of the insulating substrate 1. The thickness of the thin-film need not be about half of that for the third embodiment shown in FIG. 4, and the thin-film is formed by sputtering to a thickness necessary to enable adjustment of a resistance value thereof so as to obtain a resistance value as desired. Subsequently, by use of photolithographic techniques for etching after forming a mask, the through-hole 41 is formed at respective electrode-forming spots at the opposite ends of the first layer 4*a*, thereby exposing portions of the insulating substrate 1. At this point in time, the first layer 4*a* may be etched in a pattern as required, however, in the case where the second layer 4*b* is to be rendered into the identical pattern, such etching may be executed after the formation of the second layer 4*b*. Thereafter, annealing is applied thereto at a temperature in the range of 300 to 600° C. for about 30 to 100 minutes.

Figure 8B:
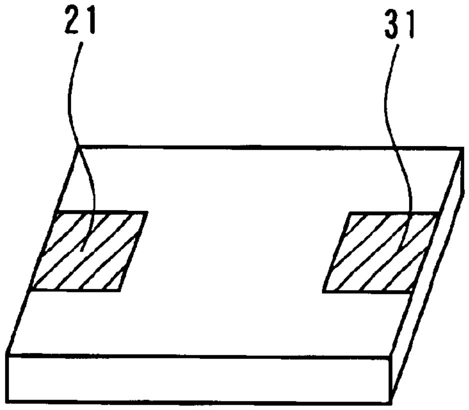
Figure 8C:
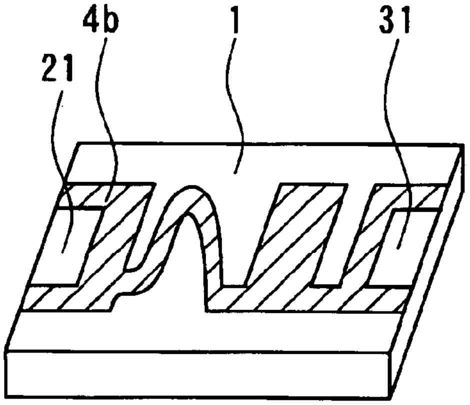

Further, as shown in FIG. 8B, the upper surface electrodes 21, 31 are formed by the thick-film forming method on respective spots at the opposite ends of the first layer 4*a*, where the through-holes 41 have been formed, respectively. As with the previously described embodiments, these electrodes are formed by printing, drying, and curing, or firing. That is, the constituent material of the electrodes (in the case of a resin based material) is cured at a temperature in the range of about 200 to 240° C. and the constituent material of the electrodes (in the case of a glass based material) is fired at a temperature in the range of about 400 to 600° C.

Figure 8D:
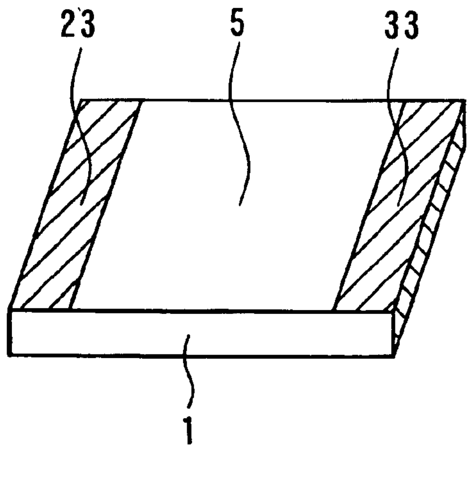
Figure 9:
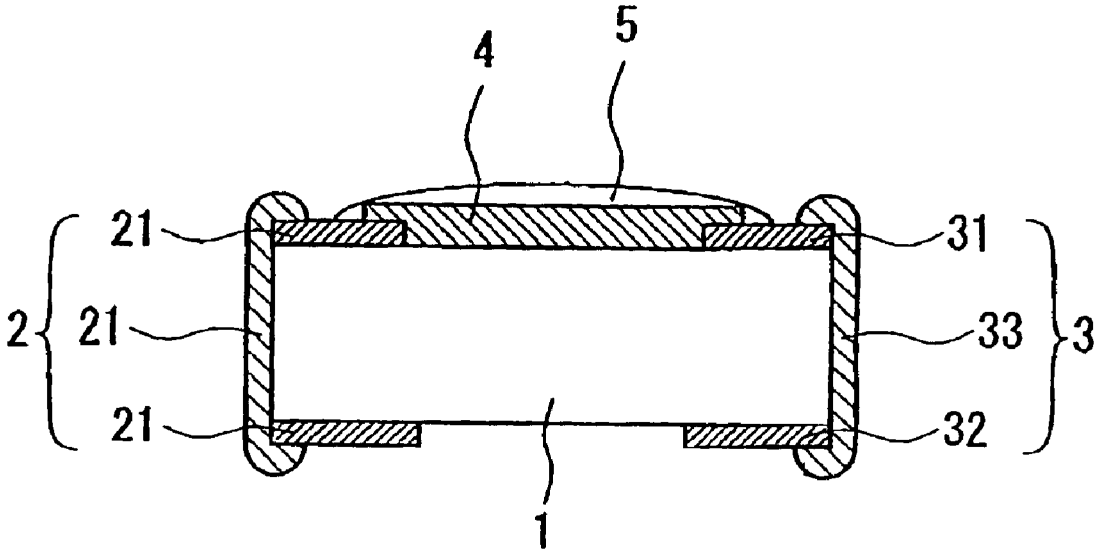
FIG. 9 (PRIOR ART)
FIG. 9 is a sectional view illustrating the construction of a conventional chip resistor.

Next, the second layer 4*b* of the resistance 4, made of a constituent material, not reacting with NaCl, such as, for example, Ta—N etc., is rendered into a thin-film by the sputtering method, and so forth as with the case of the first layer 4*a*, and the thin-film is patterned in a desired shape. At this time, patterning is executed so as to expose at least respective portions of the upper surface electrodes 21, 31, at opposite ends of the second layer 4*b*. In the case where the constituent material of the first layer 4*a* is different from that of the second layer 4*b* as in this case, use is made of an etchant suitable for etching the respective layers. Thereafter, annealing is performed at a temperature in the range of 300 to 6000□C. Subsequently, a resistance value is adjusted by laser beam trimming, and resin protection films 52, 53, in a necessary number of layers, are formed. After rendering the insulating substrate 1 into pieces, each in a bar-like shape, the side electrodes 23, 33 of the thick film are formed as previously described (refer to FIG. 8D), and after the formation of individual chips, the Ni plating layers 23*a*, 33*a*, and Pb/Sn plating layers 23*b*, 33*b* are formed on the side electrodes 23, 33, respectively, thereby obtaining the chip resistor as shown in FIG. 7 as with the cases of the previously described embodiments.

With the embodiments described with reference to FIGS. 7 and 8, since the resistance of the thin-film having excellent characteristics is combined with the thick-film electrodes that can be fabricated at a low cost, the upper surface electrodes 21, 31, provided on top of the first layer 4*a* of the thin-film resistance 4, is bonded to the insulating substrate 1 with excellent tackiness through the intermediary of the through-holes 41 provided in the first layer 4*a*, and since the second layer 4*b* of the thin-film resistance 4, provided on top of the upper surface electrodes 21, 31, represents a case of a thin-film provided on top of a thick-film, quite excellent adhesion can be attained between the upper surface electrodes 21, 31 and the second layer 4*b*. Further, since both the first layer 4*a* and the second layer 4*b* are formed of the thin-film, respectively, there is attained excellent adhesion therebetween, so that the upper surface electrodes 21, 31 have excellent adhesion with the thin-film resistance 4, and can be deposited on the insulating substrate 1 with excellent tackiness. Further, with adoption of such a construction as described, the second layer 4*b* will not be lost even if it comes into contact with human sweat and seawater because the same does not undergo chemical reaction with NaCl contained in human sweat and seawater, and further, if, for the resistance rendered into two layers, use is made of constituent materials having respective temperature coefficients with polarities opposed to each other, such as Ni—Cr in combination with TaN as previously described, it becomes possible to obtain a chip resistor having a stable resistance value regardless of temperature.

With the chip resistor according to any of the embodiments described hereinbefore, since all the electrodes are formed of the thick-film while only the resistance is formed of the thin-film, there is not much increase in the number of process steps, thereby enabling the chip resistor to be fabricated at a low cost. In addition, since the resistance prone to affecting its resistance characteristics is formed of the thin-film made by sputtering, a thin metal film is formed of a uniform material to a uniform thickness, thereby enabling the chip resistor to be fabricated with extremely high precision.

With the invention, since the thin-film resistance is formed of the constituent material unsusceptible to chemical reaction with NaCl, and the side electrodes etc. are formed of the thick film, even adhesion of human sweat and seawater thereto will not cause the electrodes, and the resistance to be lost. Further, while a high-performance chip resistor is regarded obtainable because the resistance having quite significant effects on resistance characteristics is formed of the thin-film, the chip resistor can be obtained at a very low cost since all the electrodes are formed of the thick-film, thereby rendering a fabrication process very simple, requiring fewer steps. Furthermore, with the chip resistor according to the invention, a problem of tackiness due to the formation of the thick-film over the thin-film is resolved, so that there occurs little deterioration in the characteristics thereof as compared with the case where a chip resistor is formed of thin-films only.

What is claimed is:

1. A chip resistor comprising:

an insulating substrate;

thick-film upper surface electrodes formed at opposite ends of the top surface of the insulating substrate;

a thin-film resistance made of a constituent material not reacting with NaCl, and formed so as to be extended over the upper surface of the insulating substrate and respective portions of the upper surface of the thick-film upper surface electrodes;

thick-film back surface electrodes formed at spots on the back surface of the insulating substrate, corresponding to the thick-film upper surface electrodes, respectively; and thick-film side surface electrodes connecting the thick-film back surface electrodes with respective portions of the thick-film upper surface electrodes, exposed out of the thin-film resistance, respectively, wherein the thin-film resistance comprises a plurality of stacked thin films, and at least the outermost thin film layer thereof is made of a constituent material not reacting with NaCl, wherein a constituent material of a first of said thin-films in said thin film resistance is different from a constituent material of a second of said thin films.

2. A chip resistor according to claim 1, wherein the thick-film upper surface electrodes comprise first thick-film upper surface electrodes and second thick-film upper surface electrodes, electrically conductive with the first thick-film upper surface electrodes, and opposite ends of the thin-film resistance are sandwiched between the first thick-film upper surface electrodes and the second thick-film upper surface electrodes, respectively.

* * * * *